United States Patent [19]
Kawata

[11] Patent Number: 5,876,881
[45] Date of Patent: Mar. 2, 1999

[54] MANUFACTURING METHOD FOR MASK FOR CHARGED-PARTICLE-BEAM TRANSFER OR MASK FOR X-RAY TRANSFER

[75] Inventor: Shintaro Kawata, Ibaraki-ken, Japan

[73] Assignee: Nikon Corporation, Tokyo, Japan

[21] Appl. No.: 956,690

[22] Filed: Oct. 24, 1997

[30] Foreign Application Priority Data

Oct. 25, 1996 [JP] Japan ................................ 8-283826

[51] Int. Cl.$^6$ .................................................. G03F 9/00
[52] U.S. Cl. ................................................ 430/5; 430/296
[58] Field of Search ............................... 430/5, 322, 296; 378/34, 35

[56] References Cited

U.S. PATENT DOCUMENTS

| | | | |
|---|---|---|---|
| 5,115,456 | 5/1992 | Kimura et al. | 378/35 |
| 5,260,151 | 11/1993 | Bergerr et al. | 430/5 |
| 5,728,492 | 3/1998 | Kawata | 430/5 |

FOREIGN PATENT DOCUMENTS 7-135129  5/1995  Japan .

OTHER PUBLICATIONS

Behringer et al., "Repair Techniques for Silicon Transmission Masks Used for Submicron Lithography," *J. Vac. Sci. Technol.* B4:94–99 (Mar. 1986).

Bohlen et al., "Electron–Beam Proximity Printing–A New High–Speed Lithography Method for Submicron Structures," *IBM J. Res. Develop.* 26:568–579 (Mar. 1982).

*Primary Examiner*—S. Rosasco
*Attorney, Agent, or Firm*—Klarquist Sparkman Campbell Leigh & Whinston, LLP

[57] ABSTRACT

Methods are disclosed for manufacturing masks for charged-particle-beam (CPB) or X-ray transfer. The masks have substantially no pattern defects. In a representative method for making stencil masks, the mask is defined using multiple subfields each having a respective pattern of voids. The subfields are separated from each other by boundary regions lacking any pattern features. The boundary regions include supports to provide the mask with physical and thermal stability. The supports are formed by an etching step in which relatively large amounts of substrate are removed. In the methods, the mask pattern is formed, inspected, and "repaired" as required before performing the etching step that forms the supports. Thus, the forming, inspection, and repair steps can be performed before the mask is made too delicate.

15 Claims, 6 Drawing Sheets

MANUFACTURING METHOD FOR MASK FOR CHARGED-PARTICLE-BEAM TRANSFER OR MASK FOR X-RAY TRANSFER

FIELD OF THE INVENTION

This invention pertains to methods for manufacturing masks (the term encompassing any of various masks and reticles) defining a pattern intended to be "transferred" (i.e., projection-exposed) onto a substrate that is sensitive to radiation (e.g., light or X-rays) or a charged-particle beam (e.g., electron beam or ion beam) using a microlithography apparatus.

BACKGROUND OF THE INVENTION

Advances in semiconductor integrated circuit (IC) technology in recent years have been remarkable, with exceptional trends in the miniaturization and increased integration of semiconductor elements in IC devices. So-called optical stepper apparatus and other projection-exposure apparatus that employ light for transferring the pattern from the mask to the substrate are in common use as microlithography apparatus for imprinting integrated circuit patterns on semiconductor wafers and other substrates. Such apparatus comprise a projection-optical system to effect transfer of the mask pattern to the substrate.

As used herein, a "transfer apparatus" encompasses any of various projection-exposure apparatus operable to perform projection-imprinting (transfer) of a pattern defined by a mask onto a surface of a sensitive substrate. Transfer apparatus include steppers and the like. Most transfer apparatus are "reducing" which means that the image of the pattern formed on the substrate is smaller than the corresponding pattern on the mask.

With continued advances in the miniaturization of circuit patterns, and in consideration of the resolution limitations of light, much recent research and development on microlithography has been directed to transfer apparatus that employ shorter-wavelength electromagnetic radiation (e.g., X-rays) or charged-particle beams ("CPBs", e.g., electron beams, ion beams) rather than visible or UV light.

Conventional masks used in CPB reducing-transfer apparatus (specifically an electron-beam reducing transfer apparatus) are shown in FIGS. 4 and 5(a)–5(b). Referring to FIG. 4, the mask 21 comprises a silicon mask substrate 22 that defines through-holes (voids) 23. The mask substrate 22 is sufficiently thick (e.g., 50 μm) to absorb electrons irradiated onto the mask 21. Some of the electrons in the beam EB pass through the voids 23 and are focused by a pair of projection lenses 24a, 24b onto a "sensitive" surface (e.g., a surface coated with a resist) of a suitable substrate (e.g., a silicon wafer). Thus, a pattern collectively defined by the array of voids 23 is transferred to the sensitive substrate 25. Such masks are conventionally termed "stencil" masks.

Referring to FIGS. 5(a) and 5(b), a portion of another type of conventional mask 100 is shown. The mask pattern is defined in part by selectively applied regions of an electron-scattering material 30a formed on the surface of a mask membrane 20 usually made of silicon. The mask membrane 20 is sufficiently thin to allow electrons to easily pass therethrough. Masks in which a pattern is formed by defined regions of scattering material on a membrane lacking voids, as in FIGS. 5(a)–5(b), are termed "scattering transmission masks" or simply "scattering masks".

When electrons are irradiated onto the scattering mask 100, the degree of forward scattering of electrons is greater for the electrons EB2 that have passed through the electron-scattering material 30a and the mask membrane 20 than for the electrons EB1 that have passed through only the mask membrane 20. An aperture stop 7 (defining an aperture 7a) is situated in the vicinity of a crossover CO of the electron beam formed by refraction of the beam by the projection lens 5. Contrast in an image formed on the sensitive substrate 110 is achieved according to the degree of scattering of the electrons EB1, EB2.

Stencil masks typically have the following problems: (1) it is impossible to form an annulus-shaped feature with a continuous through-hole; and (2) most of the irradiating electrons are absorbed by the mask substrate 22 which heats the mask and causes the mask to experience substantial heat deformation and pattern distortion. To solve such a problem, attempts have been made to reduce the thickness of the mask substrate and/or to provide the stencil mask with an electron-scattering membrane to create a "scattering stencil" mask in which through-hole features are formed in the membrane.

With scattering transmission masks, since the scattering material 30a is supported by the membrane 20, annular shaped features can be formed, resulting in free-standing islands in the scattering material 30a, as indicated by feature A shown in FIG. 5(a).

Further with respect to a scattering transmission mask, since the scattering material 30a need not completely block irradiating electrons, the proportion of the electrons obstructed by such portions of the mask can be relatively small. Consequently, heat generation can be reduced compared to a stencil mask.

For use in making the mask membrane in scattering stencil masks and in scattering transmission masks, $Si_3N_4$, Be, C (diamond), SiC, $Al_2O_3$, Al, Si, $SiO_2$, etc., have been evaluated. (Tungsten and gold have been evaluated as candidate materials for use as the scattering material in scattering transmission masks). Unfortunately, the oxide of Be is toxic, and light elements and light-element compounds such as $Si_3N_4$, C (diamond), SiC, $Al_2O_3$, Al, Si, $SiO_2$, etc., exhibit low transmissivity to electrons due to the relatively short mean free path of electrons through such materials. Also, all of the conventional membrane materials are either monocrystalline or polycrystalline. Unless such materials are sufficiently thin, they are incapable of sufficiently suppressing absorption or scattering of the charged particles in the beam.

With a scattering transmission mask, the contrast of a projected pattern image is conventionally increased by increasing the scattering of the CPB in the scattering material 30a and decreasing the absorption or scattering of the CPB in the membrane 20. (With a scattering stencil mask, contrast is increased by decreasing the absorption of the CPB in the membrane.)

To such end, decreasing the thickness of the membrane 20 to approximately 10 nm has been studied in scattering transmission masks. Nevertheless, there remains a likelihood of the temperature of the membrane increasing excessively due to the radiant energy absorbed by the scattering material 30a, causing distortion of the mask (pattern distortion) and diminishing transfer precision. Also, if the membrane 20 is made too thin, its strength greatly decreases and the membrane becomes unable to support the scattering material 30a.

It is difficult for heat acquired by the scattering material 30a to escape. As a result, localized temperature increases can be extreme, especially in and around isolated islands of scattering material 30a (e.g., region A of in FIG. 5(a)).

Hence, in order to suppress absorption or scattering of a charged-particle beam in the membrane while preventing deterioration of transfer precision due to pattern distortion accompanying temperature increases in the mask membrane, the mask membrane should be very thin. In many instances, this requires that the mask include some additional structure providing thermal and mechanical support for the mask membrane. Consequently, contemporary masks for CPB microlithography are typically divided into multiple subfields each including a respective portion of the overall pattern defined by the mask. Each subfield is separated from its neighboring subfields by intervening boundary regions. The boundary regions do not define any portion of the pattern. Rather, each boundary region typically has an underlying structural feature. The structural features collectively form a comparatively rigid lattice substructure for the mask that thermally and structurally supports the entire mask. Such configurations are found in both scattering transmission masks and scattering stencil masks.

FIGS. 6(a)–6(b) show a conventional scattering transmission mask 100 for use in an electron-beam reducing transfer apparatus. The mask 100 comprises a regular array of multiple subfields 100a. Each subfield 100a contains a respective portion of the overall pattern defined by the mask 100 to be transferred to a sensitive substrate 110. The subfields 100a are separated from one another by boundary regions 100b that form a grid pattern across the mask 100. Referring to FIG. 5(b), supports Xa, Xb underlie respective boundary regions 100b of each subfield 100a and thus provide a structural grid for the entire mask. The mask 100 comprises a mask membrane 20 (FIG. 5(b)) that is transmissive to electrons. Applied to the upper surface of the mask membrane 20 within each subfield 100a are regions of an electron-scattering material 30a and spaces 20a therebetween that define, in each subfield 100a, the respective portion of the overall pattern defined by the mask.

When an electron beam is irradiated on a mask subfield 100a, electrons EB2 passing through the scattering material 30a and the membrane 20 experience a greater degree of forward scattering than electrons EB1 passing through the spaces 20a and the membrane 20.

A conventional electron-beam reducing transfer apparatus typically comprises a pair of projection lenses 5, 6 (FIG. 5(b)) for projecting the mask pattern onto a sensitive substrate 110. The apparatus also comprises a scatter aperture stop 7 defining an aperture 7a that transmits only those electrons passing through or near the crossover CO formed by the projection lens 5. As a result of the different degrees of electron scattering discussed above, and as shown in FIG. 5(b), most of the electrons EB2 scattered by passage through the electron-scattering material 30a and the membrane 20 are blocked by the scatter aperture stop 7. In contrast, most of the electrons EB1 passing through the spaces 20a and the membrane 20 pass through the aperture 7a.

An alternative scheme found in the prior art utilizes a scatter aperture stop 7 lacking a center aperture 7a and defining an annular aperture instead. With such a scheme, the resist is exposed in a differential manner that imprints a pattern whose features are defined by the scattering material 30a.

The mask subfields 100a are sequentially "transferred" to the sensitive substrate 110 subfield-by-subfield in each row and row-by-row. For example, as shown in FIG. 6(b), the subfields 100a are sequentially transferred by scanning the electron beam EB step-wise in the y-axis direction. After a row of subfields has been scanned, the mask 100 and substrate 110 are shifted in opposite directions along the x-axis, as shown by arrows Fm and Fw, respectively, to permit the next row of subfields to be transferred. (The subfield scanning sequence and the sequence by which the substrate 110 is exposed are indicated by arrows Am and Aw, respectively.) Such subfield-by-subfield transfer is termed "divided transfer".

During transfer, the mask and the substrate are moved in a coordinated manner. More specifically, the substrate 110 is moved in the -x direction at a velocity $V_W$ in synchrony with movement of the mask 100 in the x direction at a velocity $V_M$. The reduction ratio imparted by the combination of the projection lens 5 and the objective lens 6 from the mask 110 to the substrate 110 is denoted by $\beta$; the width of a mask subfield in the x direction is denoted by $S_x$, and each boundary region has a width in the x direction denoted $L_x$. The scan velocity $V_W$ of the substrate is expressed by:

$$V_W = \beta \cdot [S_x/(S_x+L_x)] \cdot V_M$$

Transfer of all the subfields of the mask defines one "die" on the substrate, and the substrate normally is exposed with multiple dies to form multiple devices.

When divided transfer is performed in the manner described above, the boundary regions 100b do not appear between adjacent "transfer subfields" 110b on the substrate. I.e., the transfer subfields are "stitched" together and made contiguous with each other on the substrate. To such end, a positional correction is made in the position of each transfer subfield by imparting a slight deflection of the electron beam EB after passing through each subfield 100a. The deflection is made in the y direction by an amount equivalent to the width Ly of the boundary region 100b. A similar deflection is also required (in the x direction) during each transition from one row of mask subfields to the next.

An exemplary mask 11 as would be used for X-ray projection exposure is shown in FIG. 7(a). The mask 11 comprises supports 13 on the lower surface of the mask membrane 12. (The mask membrane 12 is typically transmissive to X-rays.) The mask 11 also comprises X-ray absorbing regions 14 and "blind" regions 15 situated on the upper surface. The supports 13 provide thermal and mechanical support for the membrane 12, and serve to divide the membrane into multiple subfields 12a.

Transfer of the pattern defined by the mask 11 of FIG. 7(a) occurs by "divided transfer" as generally discussed above.

During manufacture of a mask of the types described above, when forming the pattern on the mask substrate, the pattern is not always formed as intended. Instances arise when the pattern is formed having certain defects.

If pattern transfer using a mask is used to expose only a portion of a die on a semiconductor chip, pattern defects would not be a large problem and there would be little need for pattern correction. Also, in instances in which a mask is used to expose an entire surface of a die, some pattern defects can often be tolerated due to, e.g., redundancy in the circuit. Nevertheless, only a few individual defects can usually be tolerated per chip. Also, many modern VLSI chips include regions in which defects absolutely cannot be tolerated. Thus, pattern defects have become a problem.

SUMMARY OF THE INVENTION

In view of the foregoing, an object of the invention is to provide methods for manufacturing masks for use in CPB transfer methods, or for use in X-ray transfer methods, in which masks there are no pattern defects, or at least a number of pattern defects that is within specified tolerances.

According to one aspect of the invention, a method is provided for manufacturing a stencil mask for chargedparticle-beam lithography. The mask produced by such a method comprises multiple mask subfields separated from one another by boundary regions. Each mask subfield comprises a portion of a pattern to be transferred by the mask to a target substrate. In a first step of the method, a trilaminate structure is provided comprising a monocrystalline Si layer, an intermediate layer, and a monocrystalline Si substrate. In a second step, a pattern is formed on the monocrystalline Si layer. The pattern includes portions, located in each of various subfield regions, that define voids extending depthwise in the monocrystalline Si layer; the pattern collectively corresponds with a desired stencil mask pattern for transfer to the substrate. Third and fourth steps respectively pertain to inspecting for defects in the pattern and correcting defects that are found in the inspection. In a fifth step, a patterned resist layer is formed on the Si substrate. The patterned resist layer defines intended locations of the subfields and intended locations of boundary regions between and separating the subfields from one another. In a sixth step, using the patterned resist layer as an etching mask, the Si substrate is etched in the subfield locations but not in the boundary-region locations. Thus, residual Si substrate is left in the boundary regions. In the subfield locations, a mask membrane is left exposed that comprises the intermediate layer and the patterned Si layer. In a seventh step, the exposed intermediate layer in the subfield locations is etched so as to open the voids such that the voids extend depthwise through the mask. In this method, the sixth-step etching is preferably any of the following: inductive-coupling plasma etching, side-wall-protected plasma etching, or very-low-temperature reactive-ion etching, so as to form the supports having side walls that are perpendicular or nearly perpendicular to the mask membrane. The intermediate layer is preferably an etch-stopping layer formed of a material selected from a group consisting of $SiO_2$, an etch-resistant metal, or an etch-resistant alloy of an etch-resistant metal.

According to another aspect of the invention, a method is provided for manufacturing a stencil mask for charged-particle-beam lithography. The mask comprises multiple mask subfields separated from one another by boundary regions. In a first step of the method, a boron-doped monocrystalline Si layer is formed on a first major surface of a Si wafer. In a second step, a layer of a patterning material is formed on the boron-doped monocrystalline Si layer. In a third step, voids are formed at selected locations on the layer of patterning material so as to define features of a pattern on the boron-doped monocrystalline Si layer. The pattern is divided into portions located at respective regions on the boron-doped monocrystalline Si layer, wherein each region is to be located in a respective subfield. The pattern collectively corresponds to a desired stencil mask pattern for transfer to the substrate. Fourth and fifth steps are respectively directed to inspecting the pattern for defects and correcting defects in the pattern. In a sixth step, an etching mask layer is formed on a second major surface of the Si wafer. The etching mask layer defines openings indicating intended locations of the subfields and remaining areas defining intended locations of boundary regions between and separating the subfields from one another. In a seventh step, the Si wafer is etched at the openings in the etching mask layer to form supports at the intended locations of the boundary regions, leaving the boron-doped monocrystalline Si layer with respective pattern portions extending over the resulting subfields.

In the foregoing method, the silicon wafer is preferably monocrystalline, wherein each major surface of the wafer is preferably a <110> crystal plane. The wafer preferably includes an orientation flat that is an n-type <111> crystal plane. With such a wafer, the seventh step is preferably performed by anisotropic etching so as to form the supports having side walls that are perpendicular or nearly perpendicular to the mask membrane.

Also, in the foregoing method, the patterning material is preferably a metallic element having an atomic number of 14 through 47.

According to yet another aspect of the invention, a method is provided for manufacturing a scattering transmission mask for charged-particle-beam lithography, or a mask for X-ray lithography. The mask comprises multiple mask subfields separated from one another by boundary regions. In a first step of the method, a trilaminate structure is provided comprising a monocrystalline Si layer, an intermediate layer, and a monocrystalline Si substrate. In a second step, a pattern of a desired scattering or absorbing layer is formed on the monocrystalline Si layer. The pattern includes portions located in each of various subfield regions, and collectively corresponds with a desired scattering mask pattern for transfer to the substrate. Third and fourth steps are respectively directed to inspecting the pattern for defects, and correcting defects found during the inspection. In a fifth step, a patterned resist layer is formed on the Si substrate. The patterned resist layer defines intended locations of the subfields and intended locations of boundary regions between and separating the subfields from one another. In a sixth step, using the patterned resist layer as an etching mask, the Si substrate is etched in the subfield locations but not in the boundary-region locations. This leaves residual Si substrate in the boundary regions and exposed intermediate layer in the subfield regions. In a seventh step, the exposed intermediate layer in the subfield locations is etched so as to create voids extending depthwise through the intermediate layer in the desired locations in the subfields so as to create the desired mask pattern on a membrane formed by the Si layer.

In the foregoing method, the pattern of a desired scattering or absorbing layer is preferably formed from a metallic element having an atomic number of 14 through 47. Also, the etching in the sixth step is preferably inductive-coupling plasma etching, sidewall-protected plasma etching, or very-low-temperature reactive-ion etching, so as to form the supports having side walls that are perpendicular or nearly perpendicular to the mask membrane. Also, the pattern of a desired scattering or absorbing layer produced in the second step is preferably formed from a metallic element having an atomic number of 14 through 47.

According to yet another aspect of the invention, a method is provided for manufacturing a scattering transmission mask for charged-particle-beam lithography, or a mask for X-ray lithography. In a first step of the method, a boron-doped monocrystalline Si layer is formed on a first major surface of a Si wafer. In a second step, a pattern is formed on the boron-doped monocrystalline Si layer. The pattern includes portions, located in each of various subfield regions, defining desired locations of scattering or absorbing regions. The pattern collectively corresponds to a desired scattering mask pattern for transfer to the substrate and is preferably formed from a metallic element having an atomic number of 14 through 47. In third and fourth steps, respectively, the pattern is inspected for defects, and defects are corrected. In a fifth step, an etching mask layer is formed on a second major surface of the Si wafer. The etching mask layer defines openings indicating intended locations of the subfields and remaining areas defining intended locations of boundary regions between and separating the subfields from one another. In a sixth step, the Si wafer is etched away at the openings in the etching mask layer to form supports at the intended locations of the boundary regions and a patterned mask membrane of the boron-doped monocrystalline Si layer extending over the subfields.

In the foregoing method, each major surface of the Si wafer is preferably a <110> crystal plane of monocrystalline Si. Also, the Si wafer preferably comprises an orientation flat that is an n-type <111> crystal plane. With such a wafer, the sixth step can be performed by anisotropic etching so as to form the supports having side walls that are perpendicular or nearly perpendicular to the mask membrane.

Methods according to the invention include the steps of inspecting for defects in the mask pattern and of correcting such defects. These steps facilitate the production of the masks for CPB and X-ray projection exposure that have either no pattern defects, or at least pattern defects that are within an acceptable tolerance range. Because pattern-defect correction is preferably performed before the mask membrane is formed, no changes in internal strain arise in the membrane due to pattern correction. This alleviates deformations or destruction of the membrane that would otherwise occur from changes in internal strain of the membrane.

Methods according to the invention are applicable to manufacturing stencil masks for CPB projection transfer. Such masks comprise multiple subfields each defining a distinctive through-hole pattern on the membrane and separated from one another by a boundary region lacking any pattern features.

The invention is also directed to methods for manufacturing scattering/transmission masks for CPB projection transfer or masks for X-ray projection transfer. Such masks comprise multiple subfields each defining a distinctive portion of a pattern to be projection transferred. The pattern is formed on a membrane that transmits CPBs or X-rays, and the subfields are separated from one another by boundary regions lacking any pattern features. The boundary regions can include CPB scattering or absorbing regions, or X-ray absorbing regions.

Preferably, the supports in the masks are formed so that their walls are perpendicular or nearly perpendicular to the mask membrane. With such mask structures, the portion of the mask used to form the boundary regions can be reduced. As a result, problems regarding increasing the size of the mask, increasing the deflection range for scanning the subfields, or increasing the range of motion of the mask stage, do not arise. In addition, decreased transfer precision due to increased deflection distortion that accompanies increased mask size does not occur when performing divided transfer.

Thus, since the proportion of the mask that must be used for boundary regions is reduced, masks can now be manufactured for transferring to a wafer circuit patterns of even higher levels of integration.

Methods according to the invention, as summarized above, allow production of scattering masks that exhibit little temperature increase in the scattering or absorbing regions during use. As a result, the scattering or absorbing layers need not be so thin that temperature increases become problematic, and not so thick that high-precision fabrication becomes difficult. Specifically, the scattering or absorbing material is preferably about 200 nm thick (for Ag having an atomic number of 47) to 1 μm thick (for Ti having an atomic number of 14).

The mask membrane is preferably made from a Si layer or from a B-doped silicon monocrystalline layer formed by thermal diffusion on the surface of a <110> silicon monocrystal. The B-doped silicon monocrystal can serve as an etching stopper when the membrane is being formed by anisotropic etching.

A mask membrane made from B-doped silicon monocrystal has a better coefficient of thermoconductivity than when conventional membrane materials are used. As a result, masks can be manufactured having excellent membrane heat conductivity.

The foregoing and additional features and advantages of the invention will be more readily apparent from the following detailed description, which proceeds with reference to the accompanying drawings.

BRIEF DESCRIPTION OF THE DRAWINGS

FIG. 5(a) is a plan view showing a subfield on the mask, and FIG. 5(b) is an elevational view showing projection of a pattern from the subfield of FIG. 5(a) onto a surface of a substrate.

DETAILED DESCRIPTION

The methods described herein can be directed to the manufacture of masks for charged-particle-beam (CPB) lithography and of masks for X-ray lithography. Certain aspects of the structures of such masks are similar.

In general, a scattering stencil mask for CPB lithography comprises a substrate that scatters charged particles. The substrate defines voids therein that pass the CPB, whereas regions of the substrate without voids blocks the CPB. Such a mask can include a mask membrane with regions thereon of a CPB scattering material, wherein the membrane passes the CPB and the scattering material blocks the CPB.

In general, a stencil mask for X-ray lithography comprises a substrate that absorbs X-rays. The substrate defines voids therein that pass the X-ray beam, whereas regions of the substrate without voids blocks the X-ray beam. Such a mask can include a mask membrane with regions thereon of an X-ray scattering material, wherein the membrane passes the X-ray beam and the scattering material blocks the X-ray beam.

Thus, in general, a scattering transmission mask is generally applicable to CPB lithography, not X-ray lithography.

This invention is described in connection with multiple example embodiments.

EXAMPLE EMBODIMENT 1

The first example embodiment of a mask-manufacturing method according to the invention is described below with reference to FIGS. 1 and 2.

Masks produced according to this example embodiment are particularly suitable for CPB projection transfer or X-ray projection transfer. The masks comprise multiple subfields each defining a respective portion of an overall mask pattern. The subfields are laid out on a mask membrane, and are separated from one another by boundary regions lacking pattern features. The masks also comprise supports located beneath the boundary regions.

Figure 1A:
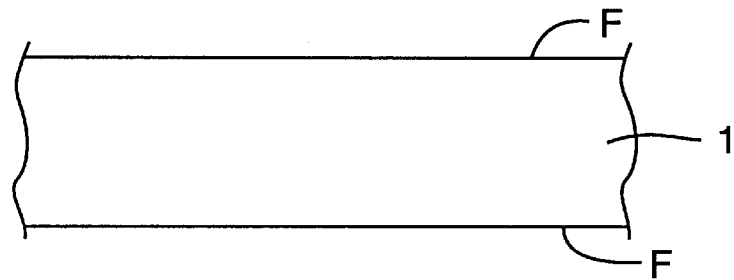
FIGS. 1(a)–1(e) are schematic elevational views of respective steps in a process for manufacturing a mask for charged-particle-beam (CPB) reducing transfer according to Example Embodiment 1.
Figure 2:
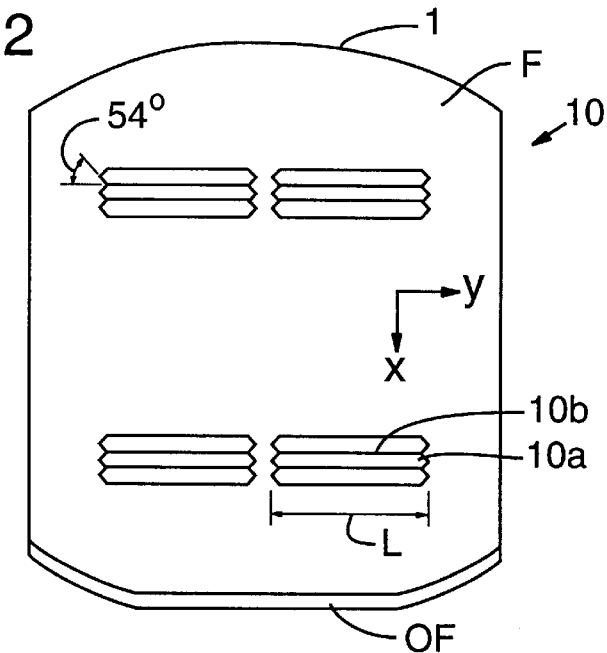
FIG. 2 is a schematic oblique view of a mask for CPB reducing transfer as produced by the method of Example Embodiment 1.
Figure 4:
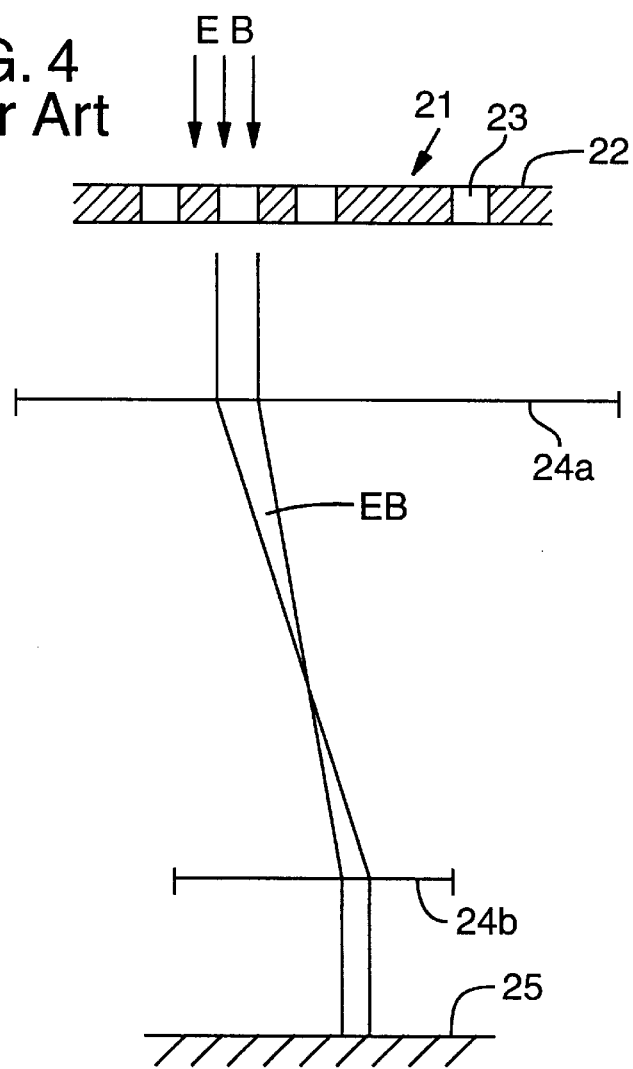
FIG. 4 shows, in a schematic elevational view, a prior-art stencil mask for electron-beam reducing transfer, and the path of an electron beam through the mask onto a surface of a substrate.

In a first step (FIG. 1(a)) of the method, a suitable substrate (e.g., monocrystalline silicon) configured as a "wafer" 1 is provided. If the substrate is monocrystalline silicon, the major surfaces F of the wafer 1 are preferably the <110> planes of the material. The wafer 1 also preferably includes an orientation flat OF along its edge in the n-type <111> plane of the monocrystalline silicon (FIG. 2).

Figure 1B:
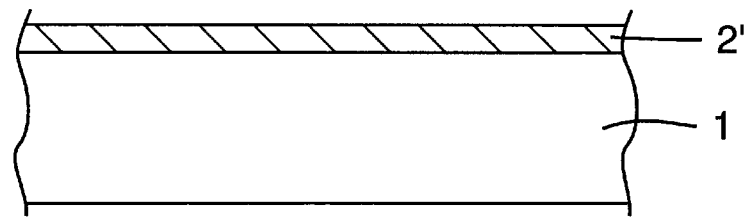

In a second step (FIG. 1(b)), a membrane layer 2' (e.g., boron-doped monocrystalline Si 50 nm thick) is formed as an epitaxial layer or as a heat-diffusion layer on one major surface of the wafer 1. This layer will serve as the mask membrane.

Figure 1C:
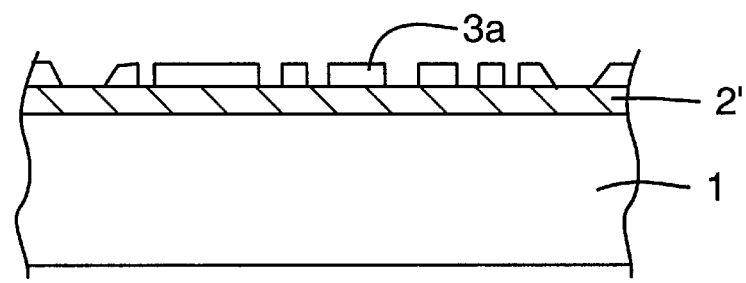

In a third step (FIG. 1(c)), pattern features 3a corresponding to the pattern to be defined by the mask are formed in predetermined locations on the surface of the membrane layer 2'. The pattern features also define locations on the mask that will be boundary regions between subfields. First, a layer of a scattering or absorbing "patterning" material (e.g., 200-nm thick Cr layer) is applied by, e.g., sputtering. A resist layer is applied to the patterning layer. The resist can be exposed as in photolithography to define a desired pattern in the resist. Afterward, an etching or analogous procedure is performed to remove unwanted regions of the patterning material. Example etching procedures include electron-beam etching or RIE etching using the resist pattern as an etching mask. The result is a patterning layer defining the desired features 3a of the pattern.

If the mask is to be a scattering stencil mask, a desired pattern of voids is formed in the mask membrane 2'. The voids can be formed by, e.g., ECR plasma etching or magnetron plasma etching.

In the fourth step, the pattern formed in the third step is checked for defects by any of various known methods.

In the fifth step, any defects found in the pattern in the fourth step are corrected. Removal of defective portions of a scattering stencil mask can be performed using, e.g., focused ion-beam etching. Additions of material needed to correct a defect in a scattering stencil mask can be performed using, e.g., charged-particle-beam-assisted epitaxial growth. Removal of defective portions (e.g., unwanted scattering or absorbing regions) of a scattering transmission mask can be performed using, e.g., focused-ion-beam etching or electrolysis (electrolytic polishing). Additions of scattering or absorbing material to correct defects in a scattering transmission mask can be performed using, e.g., laser chemical deposition, electrolytic or non-electrolytic plating, or electron-beam-assisted deposition.

In the sixth step, a $Si_3N_4$ layer and then a $SiO_2$ layer (preferably 1 $\mu$m thick each) are formed in laminar fashion on the underside major surface of the Si wafer. A photoresist is applied to the exposed major surface of the $SiO_2$ layer.

In the seventh step, one or more (preferably at least two) rows of a, by way of example, 2 mm×11 mm rectangular features are defined on the photoresist at a pitch of, e.g., 2.3 mm (FIG. 2) parallel with the orientation flat OF, to form a photoresist pattern on the $SiO_2$ layer.

Figure 1D:
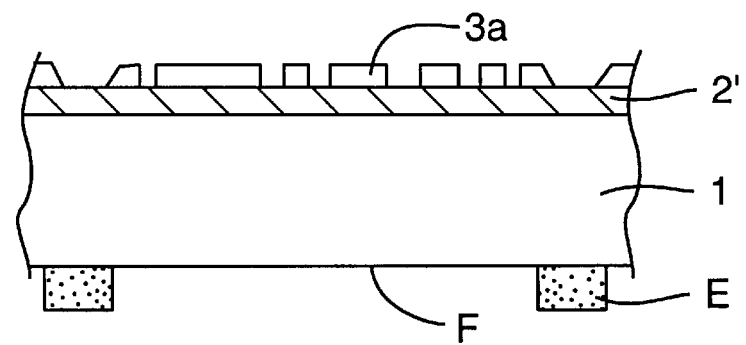

In the eighth step (FIG. 1(d)), the $SiO_2$ layer is etched using the photoresist pattern as the etching mask. Then, the $Si_3N_4$ layer is etched using the etched $SiO_2$ layer as the etching mask.

Figure 1E:
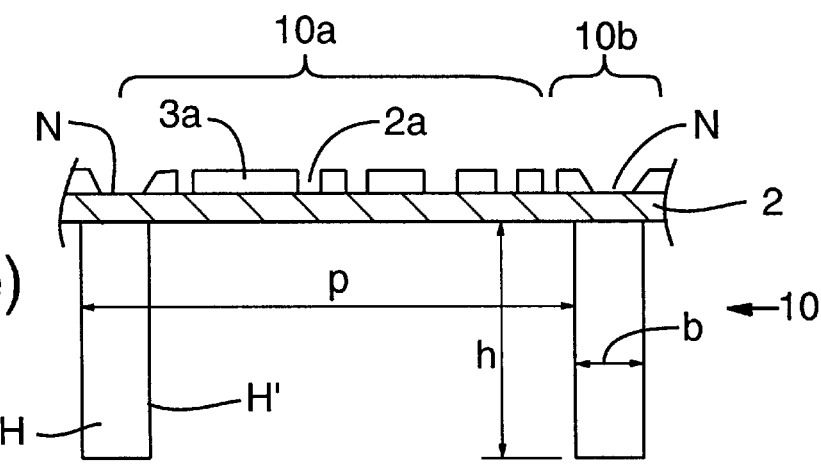

In the ninth step (FIG. 1(e)), the <110> surface F of the monocrystalline Si layer is etched using, e.g., anisotropic etching in a KOH solution, with the etched $Si_3N_4$ layer being used as the etching mask. This step provides the membrane 2' with underlying supports H made from the monocrystalline Si. The walls H' of the supports H are the <111> plane of the monocrystalline Si.

The anisotropic etching step can be performed by applying a current with a positive voltage to the <110> plane F of the Si wafer and a negative voltage to a separate electrode (e.g., Ti). Anisotropic etching stops upon reaching the <110> plane F of the monocrystalline Si at the membrane layer 2'. Etching stops because no voltage is impressed on the membrane layer 2'.

The process according to this example embodiment produces a scattering transmission mask suitable for performing CPB reducing pattern transfer. (A sectional view of the mask 10 is shown in FIG. 1(e).) The masks are produced with no pattern defects or with pattern defects that are within specified tolerances. In addition, these masks have a better coefficient of thermal conductance than prior-art masks for charged-particle-beam lithography.

The supports H have representative dimensions as follows: width b (in the x direction of FIG. 2) of preferably 300 $\mu$m; length L (in the y direction of FIG. 2) of preferably 11 mm; and height h (in the z direction of FIG. 2) of preferably 2 mm. The array pitch p of the supports is preferably 2.3 mm (FIG. 1(e)). The walls H' of the supports H are preferably in the <111> plane of the monocrystalline Si and are perpendicular to the <110> plane of the membrane 2'.

The patterning layer defining the features 3a in scattering transmission masks made according to this example embodiment is preferably made from Cr but can be made from any of various metallic elements having an atomic number of 14–47 (Cr has an atomic number of 24). The thickness of the patterning layer preferably ranges from 200 nm for Ag (atomic number of 47) to 1 $\mu$m for Ti (atomic number of 14). Thus, the scattering or absorbing features 3a are not so thin that temperature increases become problematic, and not so thick that manufacture of a high-precision mask is difficult.

With respect to a mask made according to this example embodiment, the proportion of the mask occupied by the boundary regions (which do not contribute to pattern formation) is reduced compared to prior-art masks. This is due principally to the walls of the supports being perpendicular or nearly perpendicular to the mask membrane. The mask membrane also exhibits a favorable coefficient of thermal conductance providing small temperature increases due to dissipation of energy from the charged-particle beam in the scattering or absorbing regions.

Whereas this example embodiment is directed to making a mask for CPB reducing pattern transfer, it will be understood that this example embodiment can also be applied to making masks for X-ray reducing pattern transfer.

EXAMPLE EMBODIMENT 2

The second example embodiment of a mask-manufacturing method according to the invention is described below with reference to FIG. 3.

Masks produced according to this example embodiment can be readily used as a CPB transfer mask or an X-ray transfer mask. The masks comprise multiple subfields individually separated from each other by boundary regions. The masks also comprise supports located beneath the boundary regions.

Figure 3A:
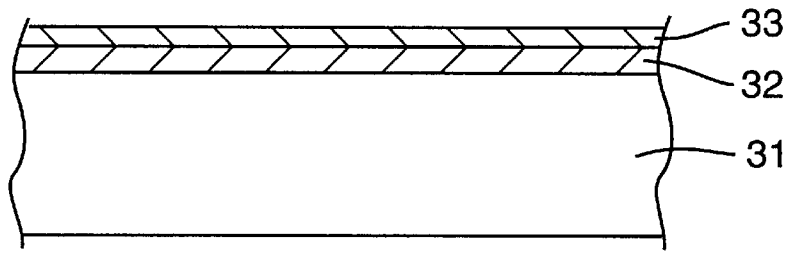
FIGS. 3(a)–3(e) are schematic elevational views of respective steps in a process for manufacturing a mask for CPB reducing transfer according to Example Embodiment 2.

In a first step (FIG. 3(a)) of the process an "SOI" laminate is formed comprising a monocrystalline Si layer 33 on a $SiO_2$ layer 32 on a monocrystalline silicon substrate 31. The upper surface of the monocrystalline Si layer 33 preferably has a <100> crystal-plane orientation.

Figure 3B:
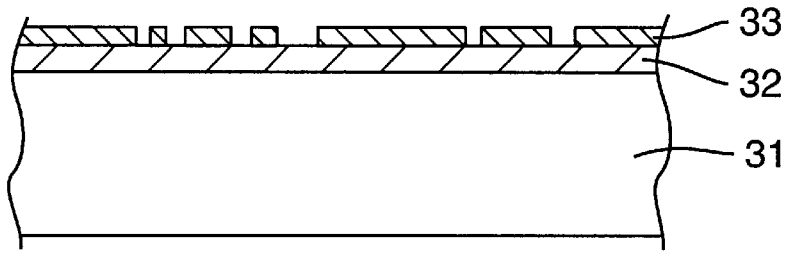

In a second step (FIG. 3(b)), pattern features corresponding to the pattern to be defined by the mask are formed in predetermined locations in the monocrystalline Si layer 33. If the mask is to be a scattering transmission mask, a layer of a CPB-scattering or CPB-absorbing material (e.g., Cr) is formed in the various predetermined locations. If the mask is to be a scattering stencil mask, a pattern of voids is formed in the monocrystalline Si layer 33 corresponding to the predetermined locations of through-holes. This step shares certain similarities with the third step of the first example embodiment.

In the third step of the process of Example Embodiment 2, the pattern formed in the second step is checked for defects by any of various known methods.

In the fourth step, any defects found in the pattern in the third step are corrected. Removal of defective portions of a scattering stencil mask can be performed using, e.g., focused ion-beam etching (e.g., etching using a gallium-ion beam at 30 kV 10 pA beam current at 50 nm pattern precision, 50 nm positional accuracy, and 10 nm or less pattern positional shift within a 1 mm×1 mm range). Additions of material needed to correct a defect in a scattering stencil mask can be performed using, e.g., CPB-assisted epitaxial growth. (E.g, by focusing an electron beam at 10 kV and 1 $\mu$A on the defective locus in a $10^{-4}$ Torr silane gas atmosphere, a 1 $\mu$m thick monocrystalline Si layer with <100>-plane orientation can be added at 0.08 $\mu$m pattern precision, 0.05 $\mu$m positional accuracy, and 10 nm or less pattern positional shift within a 1 mm×1 mm range.) Removal of defective portions (e.g., unwanted scattering or absorbing regions) in a scattering transmission mask can be performed using, e.g., focused-ion-beam etching or electrolysis (electrolytic polishing). Additions of scattering or absorbing material to correct defects in a scattering transmission mask can be performed using, e.g., laser chemical deposition, plating (electrolytic or non-electrolytic), or electron-beam-assisted deposition.

Figure 3C:
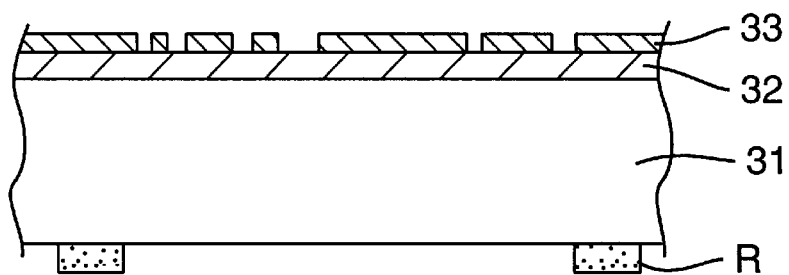

In the fifth step (FIG. 3(c)), a patterned resist layer R is formed on the under-surface of the Si substrate 31. Openings in the resist correspond with desired locations of the mask subfields.

Figure 3D:
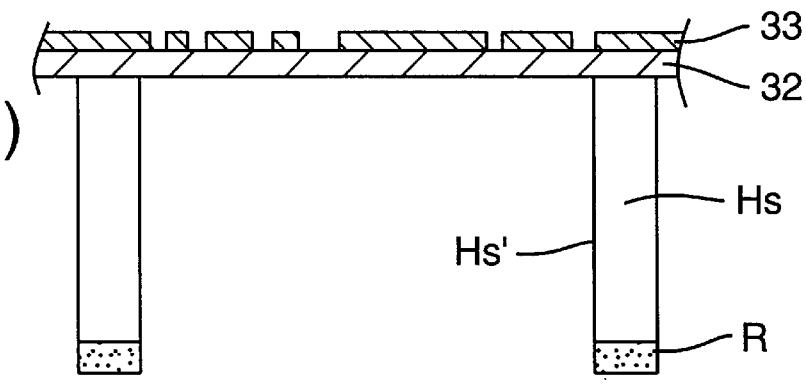

In the sixth step (FIG. 3(d)), the Si substrate 31 is etched by, e.g., inductive-coupling plasma etching (using $SF_6$/$CHF_3$ mixed gas) or very-low-temperature reactive-ion etching (substrate temperature of, e.g., $-130°$ C., using $SF_6$ gas at 10 mTorr), using the patterned resist layer R as an etching mask. This step forms multiple supports Hs with walls that are perpendicular or nearly perpendicular to the $SiO_2$ layer 32. The locations of the supports Hs correspond to the boundary regions between individual mask subfields. The locations of the resulting open spaces (e.g., 1 mm×1 mm) between the supports correspond to the desired locations of the mask subfields.

The supports Hs are formed with walls Hs' that are perpendicular or nearly perpendicular to the $SiO_2$ layer 32. The selected ratio between the resist layer R and the Si substrate 31 is 20 or more.

Figure 3E:
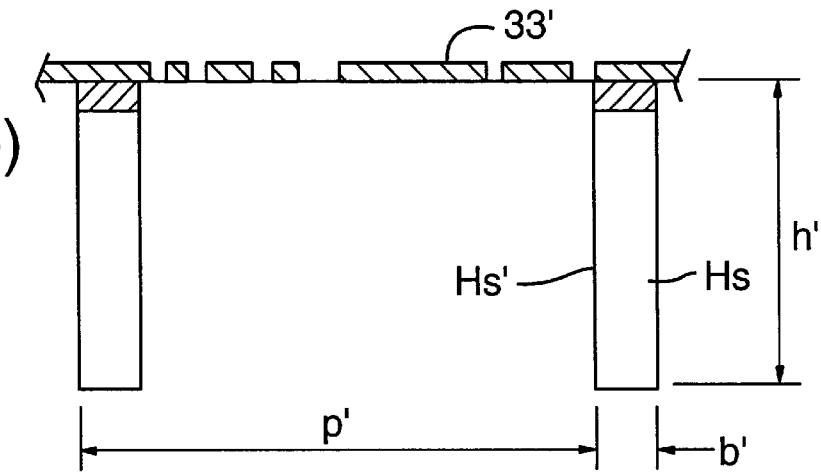
Figure 5A:
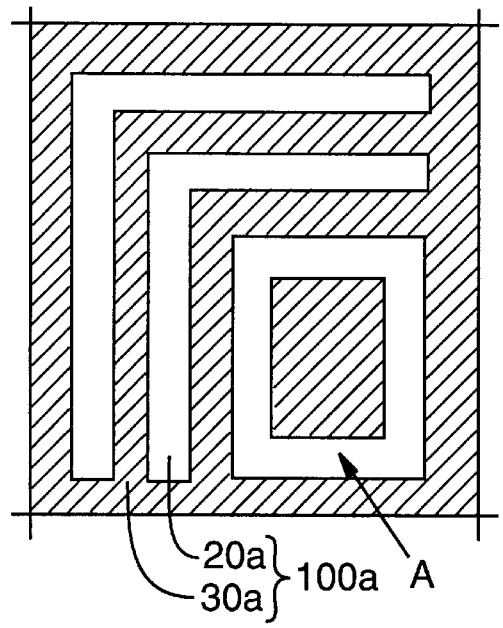
FIGS. 5(a)–5(b) schematically show a prior-art scattering transmission mask comprising a mask membrane with an underlying support grid. The members comprising the support grid have walls that are at an inclined angle to the membrane.
Figure 5B:
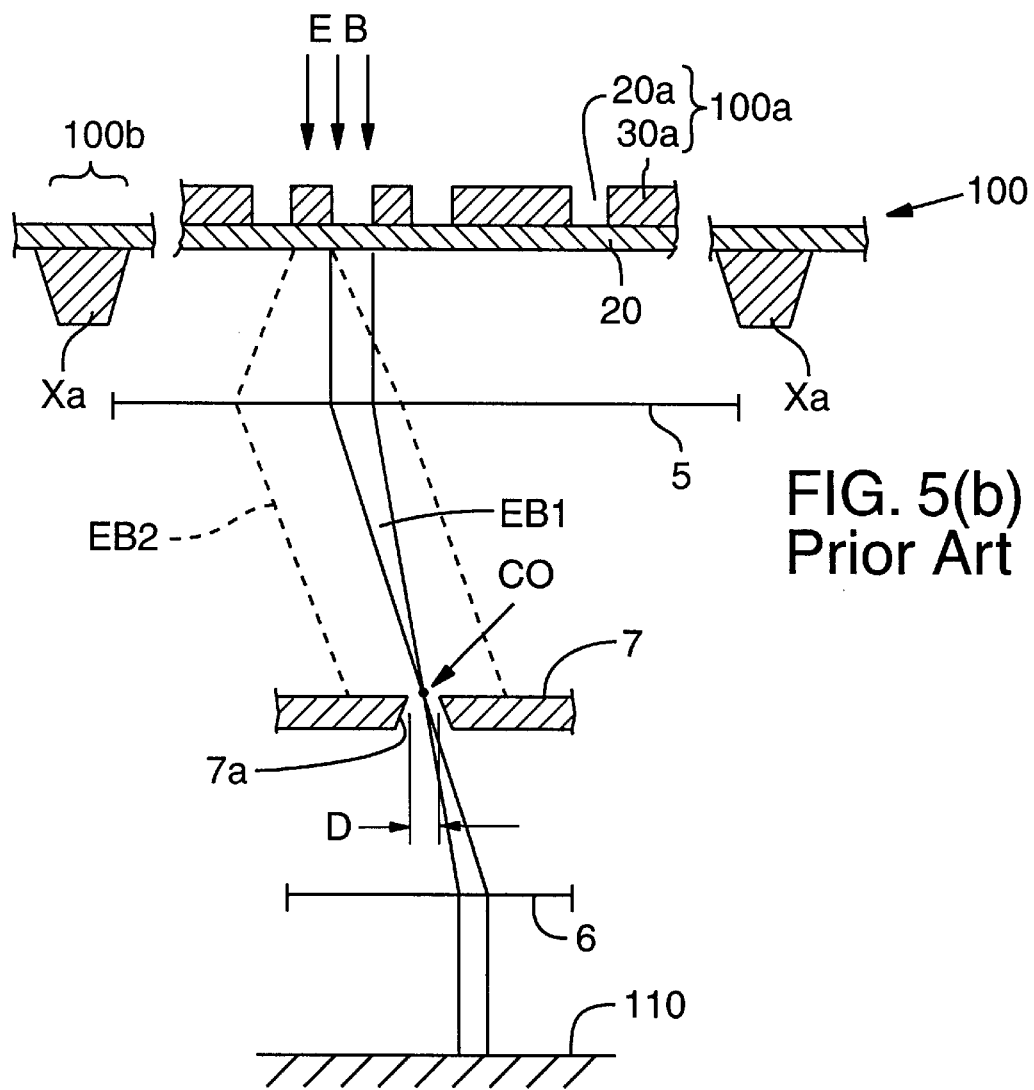
Figure 6A:
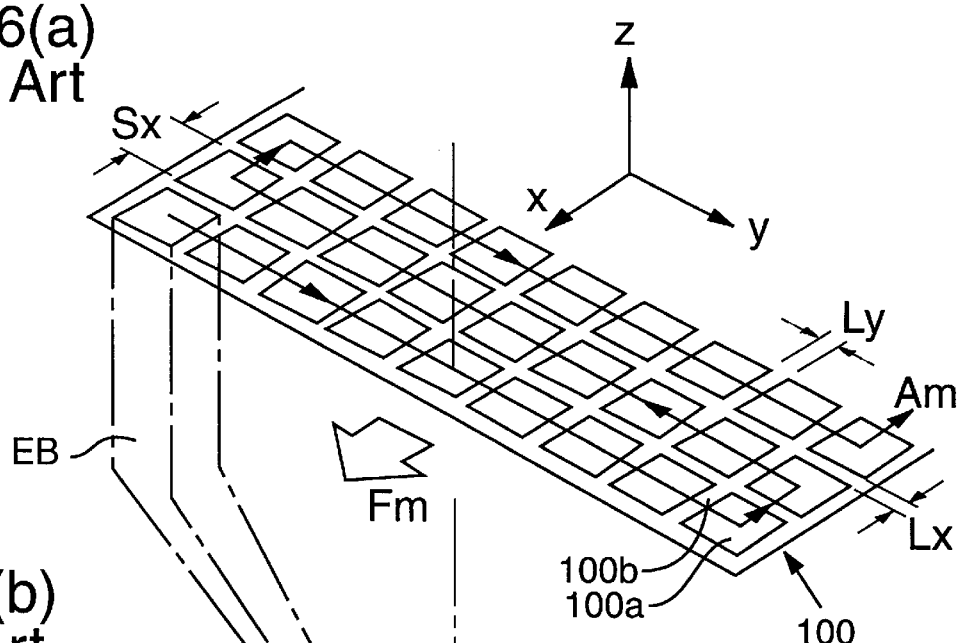
FIGS. 6(a–6(b) schematically show a sequence by which the subfields of a scattering transmission mask such as shown in FIG. 5(b) are projection-exposed onto the surface of a sensitive substrate.
Figure 6B:
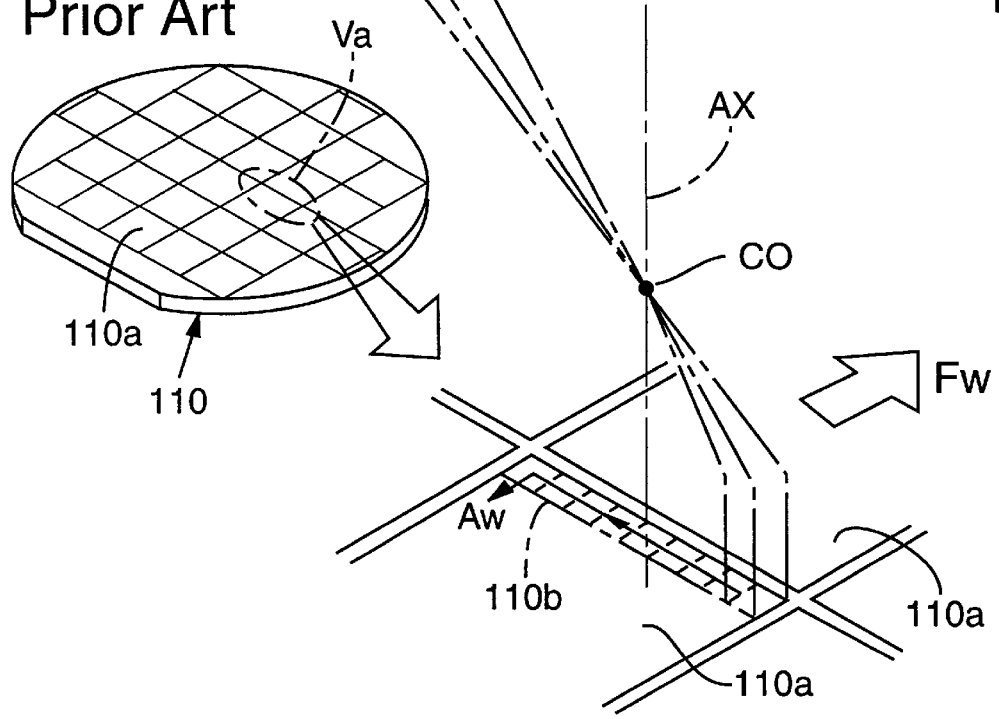
Figure 7A:
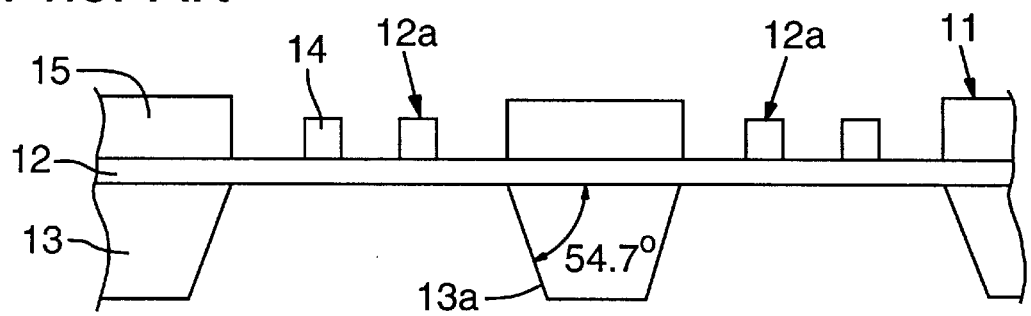
FIG. 7(a) is a schematic elevational view of a prior-art mask for X-ray projection transfer. The mask comprises supports having walls that are at an inclined angle to the mask membrane 12.
Figure 7B:
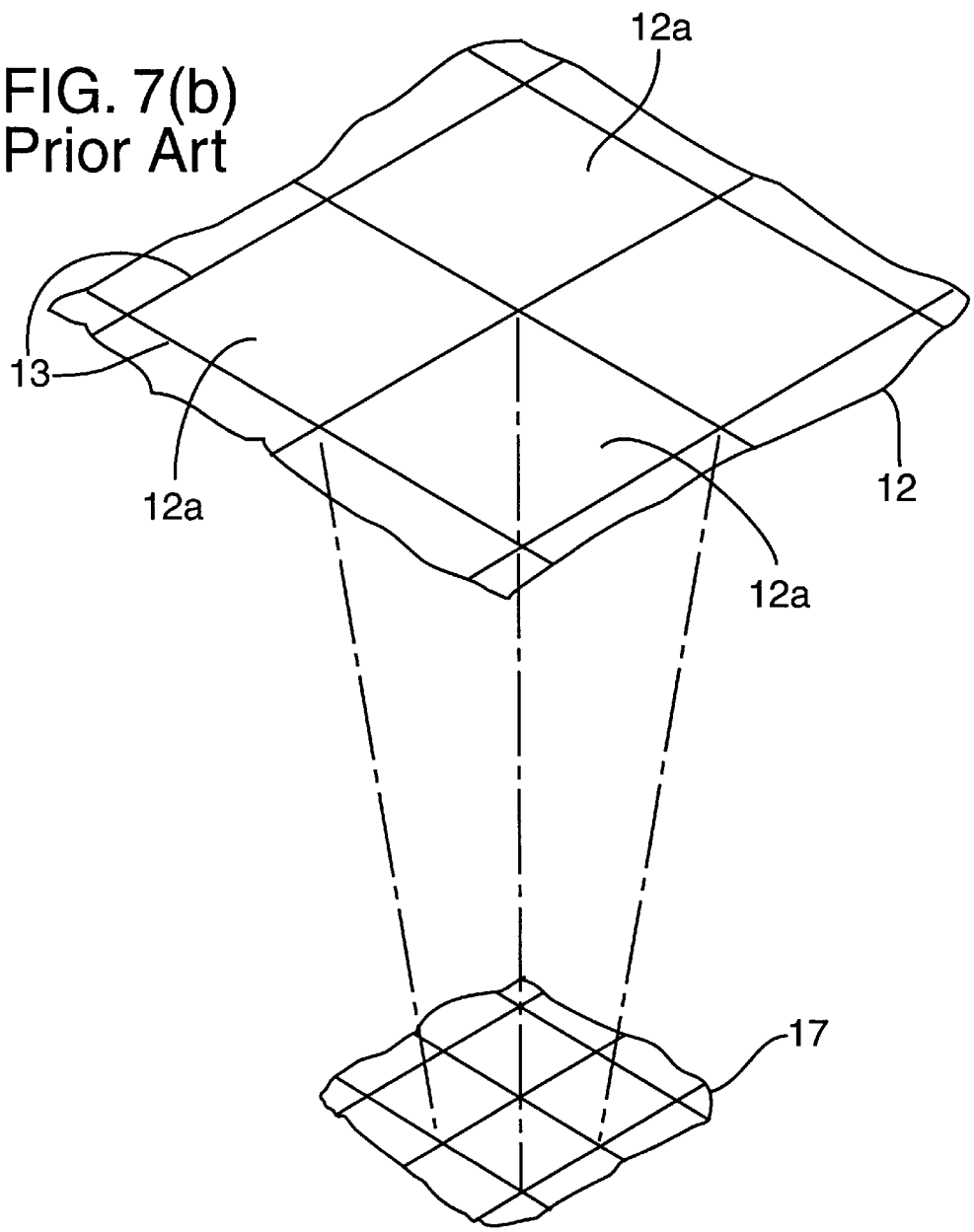
FIG. 7(b) schematically shows the reducing transfer of a pattern, on a mask as shown in FIG. 7(a), onto a substrate.

In the seventh step (FIG. 3(e)), the $SiO_2$ layer 32 in the regions between the supports is exposed. Afterward, unwanted resist layer R is removed by, e.g., dry etching to expose the underlying membrane 33' of the Si layer 32.

The process according to this example embodiment can produce masks for performing CPB reducing pattern transfer. The masks are produced with no pattern defects or with pattern defects that are within specified tolerances.

A representative section of a scattering stencil mask produced according to the method of this example embodiment is shown in FIG. 3(e). With respect to the supports Hs, representative dimensions are as follows: width b' is 100 $\mu$m, length is 1 mm, height h' is 500 $\mu$m, and array pitch p' is 1.1 mm.

Whereas this example embodiment is directed to making a mask for CPB reducing pattern transfer, it will be understood that this example embodiment can also be used for making masks for X-ray reducing pattern transfer.

Also, with masks made according to this example embodiment, the proportion of the mask occupied by the boundary regions (which do not contribute to pattern formation) is reduced compared to prior-art masks. This is due largely to the walls of the supports being perpendicular or nearly perpendicular to the mask membrane.

Whereas the invention has been described in connection with multiple example embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A method for manufacturing a stencil mask for charged-particle-beam lithography, the mask comprising multiple mask subfields separated from one another by boundary regions and each mask subfield comprising a portion of a pattern to be transferred by the mask to a target substrate, the method comprising the steps:

(a) providing a trilaminate structure comprising a monocrystalline Si layer, an intermediate layer, and a monocrystalline Si' substrate;

(b) forming a pattern on the monocrystalline Si layer, the pattern including portions located in each of various subfield regions and defining voids extending depthwise in the monocrystalline Si layer, the pattern collectively corresponding with a desired stencil mask pattern for transfer to the substrate;

(c) inspecting for defects in the pattern;

(d) correcting defects found in step (c);

(e) forming a patterned resist layer on the Si substrate, the patterned resist layer defining intended locations of the subfields and intended locations of boundary regions between and separating the subfields from one another;

(f) using the patterned resist layer as an etching mask, etching the Si substrate in the subfield locations but not in the boundary-region locations to leave residual Si substrate in the boundary regions, thereby leaving exposed in the subfield locations a mask membrane comprising the intermediate layer and the patterned Si layer; and (g) etching the exposed intermediate layer in the subfield locations so as to open the voids such that the voids extend depthwise through the mask.

2. The method of claim 1, wherein the etching performed in step (f) is inductive-coupling plasma etching, side-wall-protected plasma etching, or very-low-temperature reactive-ion etching, so as to form the supports having side walls that are perpendicular or nearly perpendicular to the mask membrane.

3. The method of claim 1, wherein the intermediate layer is an etch-stopping layer formed of a material selected from a group consisting of $SiO_2$, an etch-resistant metal, or an alloy of an etch-resistant metal.

4. A method for manufacturing a stencil mask for charged-particle-beam lithography, the mask comprising multiple mask subfields separated from one another by boundary regions, the method comprising the steps:

(a) forming on a first major surface of a Si wafer a boron-doped monocrystalline Si layer;

(b) forming a layer of a patterning material on the boron-doped monocrystalline Si layer;

(c) forming voids at selected locations on the layer of patterning material so as to define features of a pattern on the boron-doped monocrystalline Si layer, the pattern being divided into portions located at respective regions on the boron-doped monocrystalline Si layer, each region to be located in a respective subfield, the pattern collectively corresponding to a desired stencil mask pattern for transfer to the substrate;

(d) inspecting for defects in the pattern;

(e) correcting defects found in step (d);

(f) forming on a second major surface of the Si wafer an etching mask layer defining openings indicating intended locations of the subfields and remaining areas defining intended locations of boundary regions between and separating the subfields from one another; and (g) etching away the Si wafer at the openings in the etching mask layer to form supports at the intended locations of the boundary regions, leaving the boron-doped monocrystalline Si layer with respective pattern portions extending over the resulting subfields.

5. The method of claim 4, wherein:

each major surface of the Si wafer is a <110> crystal plane of monocrystalline Si, and the Si wafer comprises an orientation flat that is an n-type <111> crystal plane; and step (g) is performed by anisotropic etching so as to form the supports having side walls that are perpendicular or nearly perpendicular to the mask membrane.

6. The method of claim 4, wherein step (c) comprises the steps of applying a etching resist to the selected locations on the layer of patterning material corresponding to features of a pattern, and etching.

7. A method for manufacturing a scattering transmission mask for charged-particle-beam lithography or a mask for X-ray lithography, the mask comprising multiple mask subfields separated from one another by boundary regions, the method comprising the steps:

(a) providing a trilaminate structure comprising a monocrystalline Si layer, an intermediate layer, and a monocrystalline Si substrate;

(b) forming a pattern on the monocrystalline Si layer, of a desired scattering or absorbing layer, the pattern including portions located in each of various subfield regions, the pattern collectively corresponding with a desired scattering mask pattern for transfer to the substrate;

(c) inspecting for defects in the pattern;

(d) correcting defects found in step (c);

(e) forming a patterned resist layer on the Si substrate, the patterned resist layer defining intended locations of the subfields and intended locations of boundary regions between and separating the subfields from one another;

(f) using the patterned resist layer as an etching mask, etching the Si substrate in the subfield locations but not in the boundary-region locations to leave residual Si substrate in the boundary regions and exposed intermediate layer in the subfield regions; and (g) etching the exposed intermediate layer in the subfield locations so as to create voids extending depthwise through the intermediate layer in the desired locations in the subfields so as to create the desired mask pattern on a membrane formed by the Si layer.

8. The method of claim 7, wherein, in step (b), the pattern of a desired scattering or absorbing layer is formed from a metallic element having an atomic number of 14 through 47.

9. The method of claim 7, wherein the etching performed in step (f) is inductive-coupling plasma etching, side-wall-protected plasma etching, or very-low-temperature reactive-ion etching, so as to form the supports having side walls that are perpendicular or nearly perpendicular to the mask membrane.

10. The method of claim 9, wherein, in step (b), the pattern of a desired scattering or absorbing layer is formed from a metallic element having an atomic number of 14 through 47.

11. The method of claim 7, wherein the intermediate layer is an etch-stopping layer formed of a material selected from a group consisting of $SiO_2$, an etch-resistant metal, or an alloy of an etch-resistant metal.

12. A method for manufacturing a scattering transmission mask for charged-particle-beam lithography or a mask for X-ray lithography, the mask comprising multiple mask subfields separated from one another by boundary regions, the method comprising the steps:

(a) forming on a first major surface of a Si wafer a boron-doped monocrystalline Si layer;

(b) forming a pattern on the boron-doped monocrystalline Si layer, the pattern including portions, located in each of various subfield regions, defining desired locations of scattering or absorbing regions, the pattern collectively corresponding to a desired scattering mask pattern for transfer to the substrate;

(c) inspecting for defects in the pattern;

(d) correcting defects found in step (c);

(e) forming on a second major surface of the Si wafer an etching mask layer defining openings indicating intended locations of the subfields and remaining areas defining intended locations of boundary regions between and separating the subfields from one another; and (f) etching away the Si wafer at the openings in the etching mask layer to form supports at the intended locations of the boundary regions and a patterned mask membrane of the boron-doped monocrystalline Si layer extending over the subfields.

13. The method of claim 12, wherein, in step (b), the pattern of a desired scattering or absorbing layer is formed from a metallic element having an atomic number of 14 through 47.

14. The method of claim 12, wherein:
each major surface of the Si wafer is a <110> crystal plane of monocrystalline Si, and the Si wafer comprises an orientation flat that is an n-type <111> crystal plane; and step (f) is performed by anisotropic etching so as to form the supports having side walls that are perpendicular or nearly perpendicular to the mask membrane.

15. The method of claim 14, wherein, in step (b), the pattern of a desired scattering or absorbing layer is formed from a metallic element having an atomic number of 14 through 47.

* * * * *

UNITED STATES PATENT AND TRADEMARK OFFICE
CERTIFICATE OF CORRECTION

PATENT NO. : 5,876,881

DATED : March 2, 1999

INVENTOR(S) : Shintaro Kawata

It is certified that error appears in the above-identified patent and that said Letters Patent is hereby corrected as shown below:

Column 2, line 65, delete "of" between "A" and "in".

Column 7, line 65, "14" should be --22--.

Column 10, line 54, "14" should be --22--.

Column 12, line 53, "Si'" should be --Si--.

Signed and Sealed this

Fourth Day of April, 2000

Attest:

Q. TODD DICKINSON

Attesting Officer     Director of Patents and Trademarks